United States Patent
Hosokawa et al.

(10) Patent No.: US 6,744,048 B2
(45) Date of Patent: Jun. 1, 2004

(54) LENS SYSTEM FOR PHASE PLATE FOR TRANSMISSION ELECTRON MICROSCOPE AND TRANSMISSION ELECTRON MICROSCOPE

(75) Inventors: Fumio Hosokawa, Tokyo (JP); Kuniaki Nagayama, Okazaki (JP); Radostin S. Danev, Okazaki (JP)

(73) Assignee: Jeol Ltd., Tokyo (JP)

( * ) Notice: Subject to any disclaimer, the term of this patent is extended or adjusted under 35 U.S.C. 154(b) by 104 days.

(21) Appl. No.: 10/071,881

(22) Filed: Feb. 8, 2002

(65) Prior Publication Data

US 2002/0148962 A1 Oct. 17, 2002

(30) Foreign Application Priority Data

Feb. 9, 2001 (JP) ........................................ 2001-033799

(51) Int. Cl.$^7$ ................................................. G21K 7/00
(52) U.S. Cl. ........................ 250/311; 250/310; 359/237; 359/279
(58) Field of Search ................................ 250/310, 311, 250/306; 359/237, 279

(56) References Cited

U.S. PATENT DOCUMENTS

| | | | | |
|---|---|---|---|---|
| 3,500,043 A | * | 3/1970 | Karl ............................ | 250/311 |
| 3,569,698 A | * | 3/1971 | Herrman ..................... | 250/398 |
| 3,596,090 A | * | 7/1971 | Hoppe ......................... | 250/311 |
| 3,869,611 A | * | 3/1975 | Thon ............................ | 250/311 |
| 3,908,124 A | * | 9/1975 | Rose ........................... | 250/311 |
| 4,935,625 A | * | 6/1990 | Hasegawa et al. .......... | 250/306 |
| 4,953,188 A | * | 8/1990 | Siegel et al. ................. | 378/43 |
| 4,998,788 A | * | 3/1991 | Osakabe et al. ............. | 359/1 |
| 5,004,918 A | * | 4/1991 | Tsuno et al. ................. | 250/311 |
| 5,134,288 A | * | 7/1992 | Van Dijck ................... | 250/307 |
| 5,221,844 A | * | 6/1993 | van der Mast et al. ..... | 250/398 |
| 5,426,521 A | * | 6/1995 | Chen et al. .................. | 359/9 |
| 5,439,767 A | * | 8/1995 | Yamashita et al. .......... | 430/30 |
| 5,654,547 A | * | 8/1997 | Coene et al. ................ | 250/307 |
| 5,753,913 A | * | 5/1998 | Coene et al. ................ | 250/307 |
| 5,814,815 A | * | 9/1998 | Matsumoto et al. ........ | 250/311 |
| 6,369,932 B1 | * | 4/2002 | Gerchberg ................... | 359/237 |

FOREIGN PATENT DOCUMENTS

JP       2001273866       10/2001

OTHER PUBLICATIONS

Danev et al,"Complex Observation in Electron Microscopy", Journal of Physical Society of Japan, vol. 70, No. 3, Mar. 2001, pp. 669–702.*

* cited by examiner

Primary Examiner—John R. Lee
Assistant Examiner—Kalimah Fernandez
(74) Attorney, Agent, or Firm—Webb Ziesenheim Logsdon Orkin & Hanson, P.C.

(57) ABSTRACT

A lens system for use with a phase plate in a transmission electron microscope comprises a phase plate placed after the back-focal plane of the objective lens in an imaging system mounted downstream of the objective lens. Phase lenses image the back-focal plane of the objective lens onto the phase plate such that the position and tilt of the electron beam relative to the optical axis are made conjugate. An alignment coil may direct the electron beam going out of the phase lenses toward the phase plate. A second alignment coil may direct the electron beam going out of the phase plate toward the imaging lenses located after the phase plate.

4 Claims, 3 Drawing Sheets

B(k) = sin ( x (k) ) E (k)

Bp(k) = cos ( x (k) ) E (k)

LENS SYSTEM FOR PHASE PLATE FOR TRANSMISSION ELECTRON MICROSCOPE AND TRANSMISSION ELECTRON MICROSCOPE

BACKGROUND OF THE INVENTION

1. Field of the Invention

The present invention relates to a lens system used for a phase plate that is used in a transmission electron microscope (TEM) and also to a TEM.

2. Description of Related Art

Where a specimen is observed with a conventional TEM, two major causes of the contrast in the resulting image are scattering contrast and phase contrast. These two kinds of contrast are normally discussed regarding elastically scattered electrons. In the following description, "scattering" means "elastic scattering" unless otherwise specifically stated.

Various portions of a specimen scatter an electron beam to different extents. A scattering contrast technique is a method of causing these different intensities (quantitative variations) of scattering to be reflected in the contrast displayed in an image. Those specimen portions which are composed of a heavy element (having a large atomic number) scatter electrons more strongly. Those specimen portions which are made of a light element (having a smaller atomic number) scatter electrons more weakly. An objective aperture placed around an optical axis between the specimen and the image plane acts to pass only electrons that are weakly scattered. As a result, variations in amount of scattered electrons blocked by the objective aperture result in variations in brightness on the image plane. As the element constituting the specimen becomes heavier, the scattering contrast increases. Also, as the specimen becomes thicker in the forward direction of travel of electrons, the scattering contrast increases. However, as the thickness of the specimen is increased, electrons are inelastically scattered more strongly. In consequence, chromatic aberration blurs the image.

Where an observation is made with a TEM, if the specimen is thick in the penetration direction of electrons, the electrons are inelastically scattered, thus blurring the image. To reduce inelastic scattering of electrons, the specimen is made sufficiently thin. Therefore, the specimen causes weak elastic scattering. This makes it difficult to obtain scattering contrast that is enough for imaging. This tendency is especially conspicuous in sections of biological specimens. Accordingly, in the case of a section of a biological specimen, a certain portion of the specimen is chemically bonded to heavy metals (known as staining). This increases the scattering contrast in this portion. In this way, an image owing to scattering contrast is obtained. In the case of sections of biological specimens, scattering contrast is intrinsically hard to obtain. A specimen that should be observed intact in itself is stained (i.e., artifacts are intentionally introduced) to make an observation by making use of scattering contrast.

On the other hand, a phase contrast technique is a method of causing phase variations of electron waves to be reflected in the contrast in an image, the electron waves undergoing such variations after passing through a specimen. Electrons transmitted through the specimen without being scattered (i.e., without being affected by the specimen at all) are herein referred to as transmitted electrons. When transmitted electrons and scattered electrons interfere with each other at the image plane, a phase difference is created between them. Thus, contrast is produced. In the case of phase contrast, if the specimen is made thinner within a practically processable range, the specimen structure is more easily reflected in the image, unlike the case of scattering contrast. Accordingly, if phase contrast can be utilized for observation of sections of biological specimens, it is expected that specimen images will be easily obtained without manual operations, such as staining. In normal TEM, however, phase contrast is not easily produced under low to medium magnification observations, for the following reasons.

It is known that the Fourier component I(k) of phase contrast in a sufficiently thin specimen is given by $$I(k) = \sigma V(k) \cdot B(k) \quad (1)$$

where $$B(k) = \sin(\chi(k)) \cdot E(k) \quad (2)$$

where $\sigma$ is a constant used to convert the electrostatic potential of the specimen into phase shift and is determined by the energy of electrons, V(k) is the Fourier transform of the electrostatic potential distribution in the specimen, B(k) is a function indicating the manner in which information about the specimen is transferred, $\chi(k)$ is a wavefront aberration function, E(k) is attenuation of contrast due to partial coherence and chromatic aberration, and k is a spatial frequency.

Eq. (1) indicates that the structure V(k) of the specimen is reflected in the image via the function B(k). If the function B(k) is kept at unity over the whole spatial frequency range, the specimen structure will be precisely reflected in the image. Actual function B(k) attenuates while oscillating between positive and negative domains as shown in FIG. 1, where the spatial frequency k is plotted on the horizontal axis. The center of the vertical axis is indicated by zero. Numerical values attached to the scale on the horizontal axis indicate periods of a real space, in Angstrom unit, corresponding to the spatial frequency k. The function B(k) attenuates toward zero in a region of an inverse space where the spatial frequency k is large (corresponding to a small structure in a real space) because of attenuation E(k). This corresponds to the fact that there is an information limit in electron microscopy and a structure smaller than a certain limit cannot be viewed. During attenuation of B(k) toward zero, the function B(k) oscillates across zero. The mode of this oscillation is determined by the accelerating voltage of the TEM, the spherical aberration coefficient, and the amount of defocus. Among them, what the TEM operator can set at will is only the amount of defocus. At spatial frequencies close to the spatial frequency where the B(k) is zero, the corresponding specimen structure is partially lost from the image. To prevent the information from being lost, some contrivance is necessary. For example, the amount of defocus is appropriately varied so that the function B(k) does not assume a value of zero in the vicinity of the spatial frequency corresponding to the desired structure.

In normal TEM, phase contrast is prevalent only under high-magnification observation of crystal lattice images. On the other hand, at observation magnifications suitable for sections of biological specimens, phase contrast is not prevalent because phase contrast does not participate in imaging and, therefore, one has to depend on scattering contrast to get the images. More specifically, as can be seen from FIG. 1, B(k) is a sinusoidal function of $\chi(k)$, and $\chi(k)=0$ where k=0. Therefore, in the vicinity of k=0, B(k) remains close to zero. The spatial frequencies k close to zero are components bearing large structures of a specimen, and are in a region where a mild structure of the image is reflected. That is, information about low frequencies is lost, because B(k) is a sinusoidal function of χ(k). Therefore, an image created by phase contrast can reflect only microscopic specimen structures of the order of nanometers or less. Consequently, these structures cannot be viewed unless a high magnification is accomplished. Conversely, relatively large structures to be observed at low to medium magnifications cannot be imaged via phase contrast. Because of these circumstances, where sections of biological specimens are observed at low to medium magnifications, the TEM operator normally has to rely on scattering contrast.

Accordingly, we have already proposed an improved electron microscope and filed for a patent (Japanese Patent Publication No. 2001-273866) on this microscope for alleviating the drawback with phase contrast (i.e., large structures are not imaged under low to medium magnification observations), and for eliminating the drawback under high magnification observations (i.e., information is lost from the frequency regions within the information limit). This proposed instrument is equipped with a phase plate to give a phase difference of π/2 between transmitted electrons and scattered electrons.

More specifically, where a phase difference of π/2 is given between transmitted and scattered electrons, transfer of information about the specimen is given by $$B_p(k) = \cos(\chi(k)) \cdot E(k) \quad (3)$$

This is illustrated in FIG. 2, where the horizontal axis indicates spatial frequency k and the center of the vertical axis is indicated by zero. In FIG. 2, $B_p(k)$ using a phase plate does not suffer from loss of information about large specimen structures, because $B_p(k)$ remains close to 1 at spatial frequencies close to k=0, which arises from the fact that $B_p(k)$ is a cosine function of χ(k). Accordingly, observations making use of phase contrast are permitted at low to medium magnifications. Furthermore, $B_p(k)$ and B(k) are complementary in terms of loss of information. Therefore, under high magnification observations, complete imaging can be accomplished within the information limit by utilizing both.

The meaning that they are complementary (i.e., completeness) is that when wave motion is being observed, it is given by $$\exp(i\phi(k)) = \cos(\phi(k)) + i \sin(\phi(k)) \quad (4)$$

The essence is that both cos(φ(k)) and i sin (φ(k)) of the right side of Eq. (4) are made observable by moving the phase plate in and out. For particulars, refer to the above-cited Japanese Patent Publication No. 2001-273866.

As described thus far, an instrument that compensates for the drawbacks with phase contrast using a phase plate has been devised. However, in implementing this instrument, some problems have become apparent. The present invention has been made to solve the problems with TEM, using the following phase plate.

The phase plate needs to be placed in close proximity to the back-focal plane of the objective lens. Depending on the TEM, the back-focal plane is located within the magnetic polepieces of the objective lens. In this case, it is impossible to place the phase plate in close proximity to the back-focal plane of the objective lens. The phase plate is centrally provided with a special region through which only transmitted electrons should pass. This produces a phase difference of π/2 between transmitted electrons and scattered electrons. The transmitted electrons form a thin beam of less than tens of nanometers in diameter in the plane where the phase plate is placed. In the present situation, the region for passing the transmitted electrons is made of a circular hole having a diameter of about 1 μm around the center of the phase plate. Since it is important that the transmitted electron pass through the center of the circular hole having a diameter of approximately 1 μm, the circular hole having a diameter of 1 μm and the thin beam of electrons of less than tens of nanometers need to be aligned at an accuracy of better than 1 μm. However, it is considerably difficult to perform this alignment at this accuracy while mechanically moving the phase plate. This has been an impediment to an overall experiment on the phase plate which must be carried out smoothly.

SUMMARY OF THE INVENTION

It is an object of the present invention to provide a technique for accurately aligning transmitted electrons by aligning an electron beam by electromagnetic deflection coils instead of mechanically moving a phase plate.

Briefly, according to the present invention, a lens system for use with a phase plate in a TEM comprises a phase plate placed after the back-focal plane of the objective lens in an imaging system mounted downstream of the objective lens. Phase lenses image the back-focal plane of the objective lens onto the phase plate such that the position and tilt of the electron beam relative to the optical axis are made conjugate. An alignment coil may direct the electron beam going out of the phase lenses toward the phase plate. A second alignment coil may direct the electron beam going out of the phase plate toward the imaging lenses located after the phase plate.

It is possible to align an electron beam by electromagnetic deflection coils instead of moving a phase plate mechanically. However, if this alignment is performed with deflection coils mounted in the existing TEM, then it is impossible to align the electron beam to the corresponding lens by these deflection coils. Note that the latter alignment is the task assigned to the deflection coils in itself. Because of spatial restrictions imposed by the magnetic polepieces, it may be impossible to place the phase plate in the back-focal plane. In order to solve this problem, it is contemplated that a conjugate plane to the back-focal plane will be created by lenses and that the phase plate will be placed in the conjugate plane.

In normal optics in a TEM, the first stage image of a specimen is formed at the aperture plane of the intermediate lens at a magnification of tens of times. This first stage image is successively magnified by the succeeding stages imaging lenses. If an image is magnified and focused, the conjugate plane of the back-focal plane is inevitably demagnified when imaged. Therefore, the conjugate plane of the back-focal plane must be created before the image is focused at a high magnification of tens of times, for the following reason. If the conjugate plane of the back-focal plane is created behind the location where the image is focused at a high magnification of tens of times, the conjugate plane is demagnified by a factor of several tens. Consequently, the aforementioned region of 1 μm passing the transmitted electrons must be made to achieve a size that is tens of times smaller than 1 μm. This is not a realistic choice as a means for solving the problem.

Accordingly, if a conjugate plane to the back-focal plane is created by lenses before the first stage of image is focused at a high magnification by lenses, the existing TEM presents the following problem. In the existing instrument, a single lens is present between the objective lens and the aperture plane of the intermediate lens on which the first stage of image is created. Using this lens, a conjugate plane to the back-focal plane is formed above the aperture plane of the intermediate lens. In this case, however, the conjugate plane to the back-focal plane is created using only one lens. This spoils the tilting relation between the back-focal plane and the image plane. The positional relation should be established by the objective lens. More specifically, imaging using a single lens converts the positional relations of plural electron orbits relative to the optical axis in the object plane into equivalent relations in the image plane. With this method, however, the relation between the tilts of the orbits relative to the optical axis in the back-focal plane cannot be converted into an equivalent relation in the image plane if only one lens is used.

This is described in further detail by referring to FIG. 3. A lens L has a focal distance of $f$. Let a be the distance from the lens L to an object plane A. Let b be the distance from the lens L to an image plane B. Let $r_0$ be the position (distance from the optical axis) of an arbitrary light beam on the object plane A. Let $r_0'$ be the tilt of the beam relative to the optical axis. These are converted into $r_1$ and $r_1'$, respectively, (linear conversion) on the image plane B by the action of the lens L. This conversion is given by $$\begin{pmatrix} r_1 \\ r_1' \end{pmatrix} = \begin{pmatrix} -\frac{b}{a} & 0 \\ -\frac{1}{f} & -\frac{a}{b} \end{pmatrix} \begin{pmatrix} r_0 \\ r_0' \end{pmatrix} \quad (4)$$

$$= \begin{pmatrix} \left(-\frac{b}{a}\right) r_0 \\ \left(-\frac{1}{f}\right) r_0 + \left(-\frac{a}{b}\right) r_0' \end{pmatrix}$$

$$= \begin{pmatrix} -r_0 \\ \left(-\frac{1}{f}\right) r_0 + r_0' \end{pmatrix}$$

In the above equation, for the sake of simplicity of illustration, imaging at a magnification of 1x is assumed (a=b).

In this case, the tilt $r_1'$ of the light beam on the image plane is a function of both position $r_0$ of the beam on the object plane and tilt $r_0'$. That is, two light beams which have the same tilt but are different in position on the object plane are converted into mutually different tilts on the image plane.

As a result, if a conjugate plane to the back-focal plane is created above the aperture plane of the intermediate lens by a single lens, the first stage image of the objective lens will be formed at a position tens of millimeters above the aperture plane of the intermediate lens at a magnification that is smaller than normal magnifications by a factor of 2, 3, or other small integer. The high-magnification and low-aberration imaging characteristics of the objective lens are lost. Finally, only a low-magnification image with large aberration is obtained.

This problem is solved by a lens system which is used with a phase plate and has additional lenses for creating a conjugate plane to the back-focal plane of the objective lens. The created conjugate plane permits the back-focal plane to be imaged at a magnification of 1 or more times. The phase plate is placed in the conjugate plane. Coils for aligning the electron beam incident on the phase plate are mounted above and below, respectively, the phase plate. Lenses built in the lens system used with the phase plate in this way are so designed that tilts of the electron beam are made conjugate simultaneously (unlike the normal imaging in which a plane conjugate only to the positions of the electron beam trajectories is created). Consequently, the imaging system of a normal TEM can be essentially applied to electrons going out of the phase plate.

Specifically, even in a TEM where a phase plate cannot be placed in the back-focal plane due to spatial restrictions imposed by the magnetic polepieces of the objective lens, the phase plate can be positioned in a spatially unrestricted position by creating a conjugate plane to the back-focal plane by lenses according to the present invention.

Since the phase plate is placed in the spatially unrestricted position as described above, a dedicated alignment coil can be mounted over the phase plate. This coil makes it possible to perform an alignment such that the electron beam incident on the phase plate precisely passes through the electron passage region formed in the phase plate.

Where the dedicated alignment coil is mounted under the phase plate, electrons leaving the phase plate can be aligned such that the beam enters the axis of the magnification lens system of the TEM that follows the phase plate.

The lenses built in the lens system for use with the phase plate as mentioned previously are designed to perform imaging in such a way that tilts of the electron beam are made conjugate, as well as positions of the beam. In consequence, the relation between the back-focal plane of the objective lens in a normal TEM and the image plane is essentially unaffected by installation of the lens system for use with the phase plate. An example of design of such a lens system is described by referring to FIG. 4.

In FIG. 4, let $r_0$ be the position (distance from the optical axis) of an arbitrary light beam on the object plane A. Let $r_0'$ be the tilt of the beam relative to the optical axis. These are converted into $r_1$ and $r_1'$, respectively, on the image plane B by the action of lenses L1 and L2. This conversion is given by Eq. (5). It is assumed that the lenses L1 and L2 have the same focal distance of $f$. The lenses L1 and L2 are so placed that the distance between the object plane A and the lens L1 is $f$ and that the distance between the lenses L1 and L2 is $2f$. As a result, the image plane B is at a distance of $f$ from the lens L2. With this imaging method, positions and tilts of an arbitrary light beam on the object plane can be reproduced on the image plane.

$$\begin{pmatrix} r_1 \\ r_1' \end{pmatrix} = \begin{pmatrix} -1 & 0 \\ 0 & -1 \end{pmatrix} \begin{pmatrix} r_0 \\ r_0' \end{pmatrix} \quad (5)$$

$$= \begin{pmatrix} -r_0 \\ -r_0' \end{pmatrix}$$

That is, if the back-focal plane and its conjugate plane are imaged at a magnification of 1x by the lenses built in the lens system for use with the phase plate, the optical distance between the entrance and exit of these lenses can be considered to be zero. If the planes are imaged at a magnification of 2x, the first stage of image of the objective lens is formed also at a magnification of 2x. The original positional and tilting relation between the back-focal plane and the image plane is maintained. Therefore, TEM imaging can be performed without sacrificing the high-magnification and low-aberration characteristics of the objective lens by installing optics downstream of the optical system for use with the phase plate, the optics being normally located after the back-focal plane of the objective lens of the TEM.

Other objects and features of the invention will appear in the course of the description thereof, which follows.

DESCRIPTION OF THE PREFERRED EMBODIMENTS

Figure 1:
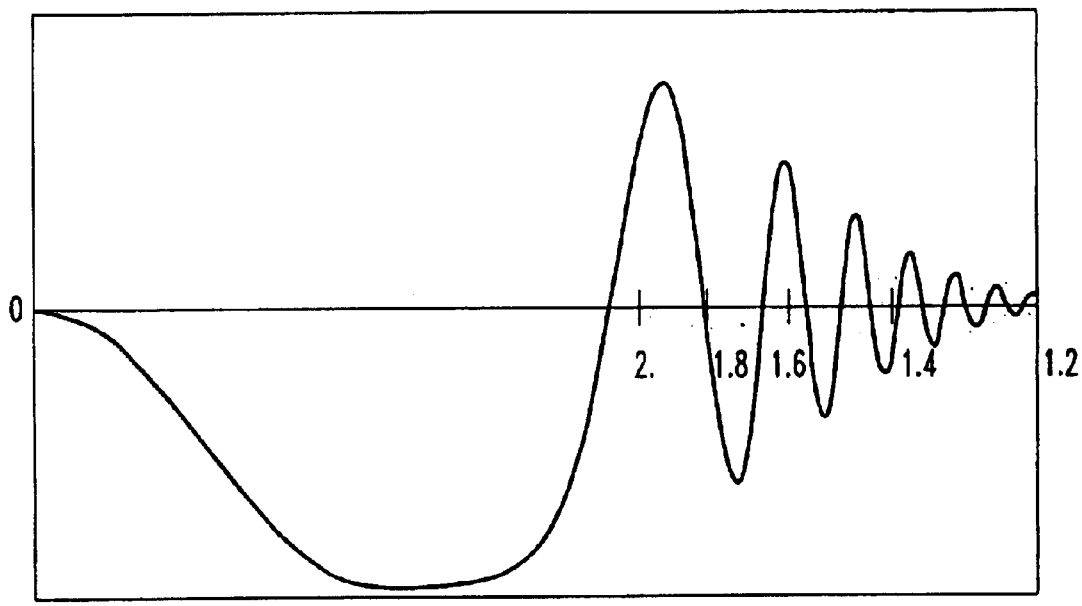
FIG. 1 is a diagram illustrating a normal function B(k)
Figure 2:
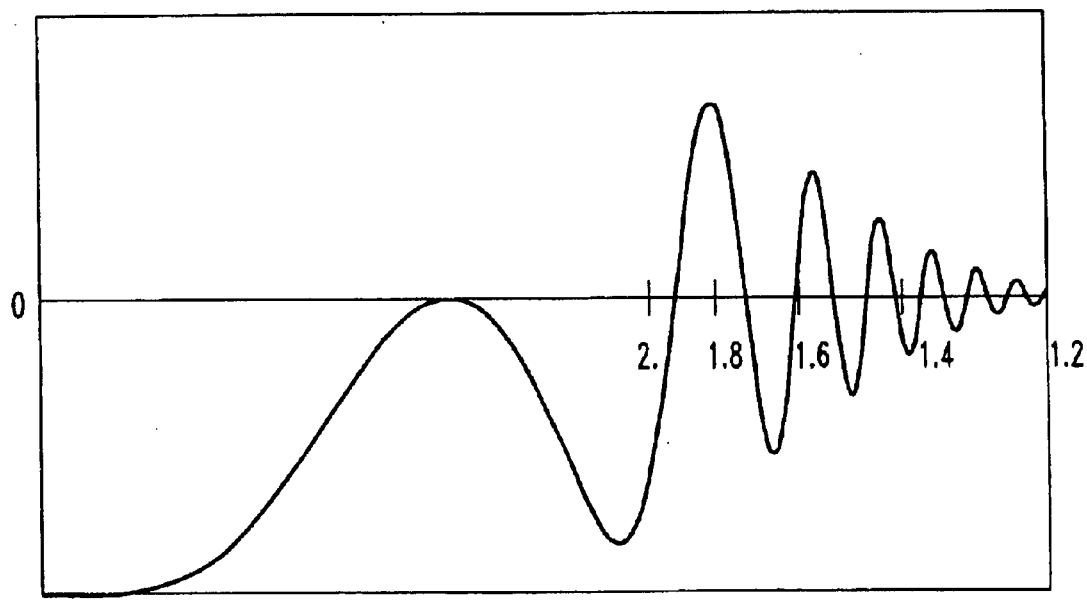
FIG. 2 is a diagram illustrating a function $B_p(k)$ using a phase plate.
Figure 3:
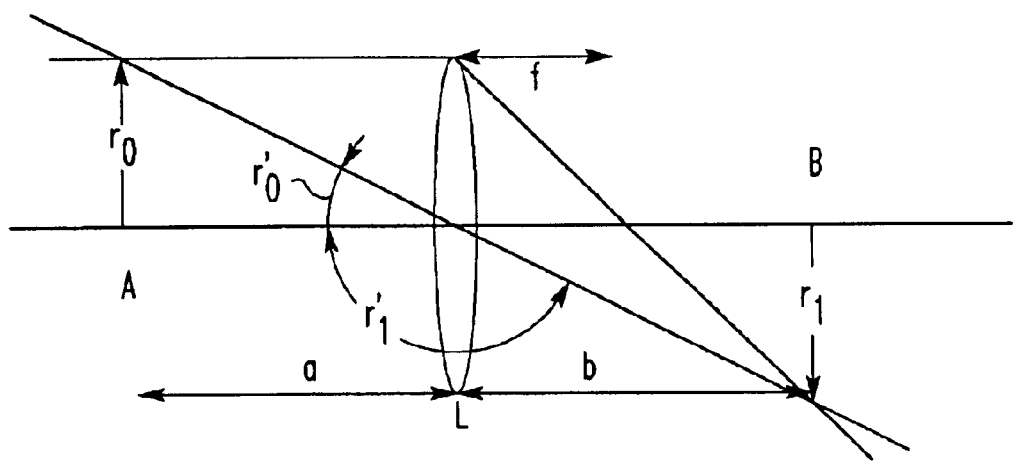
FIG. 3 is a ray diagram illustrating an example of a method of converting the positional relations of plural electron trajectories on an object plane to an optical axis into equivalent positional relations on an image plane by the use of a single lens.
Figure 4:
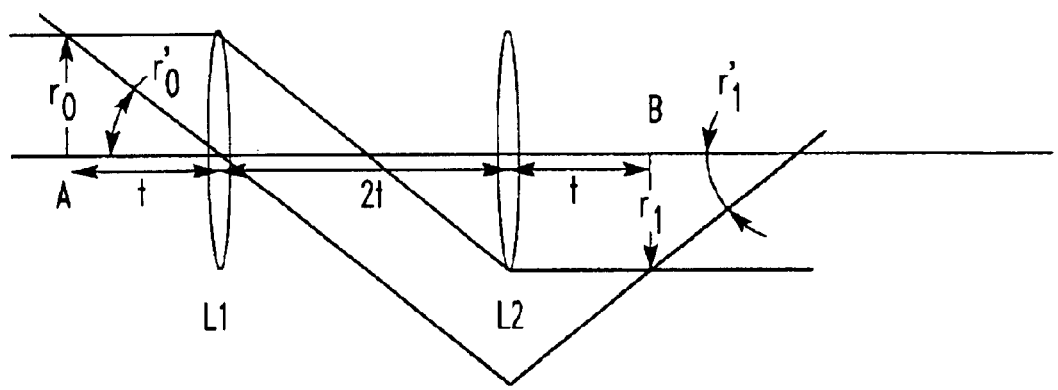
FIG. 4 is a ray diagram illustrating an example of a lens system embodying the present invention and used with a phase plate.
Figure 5:
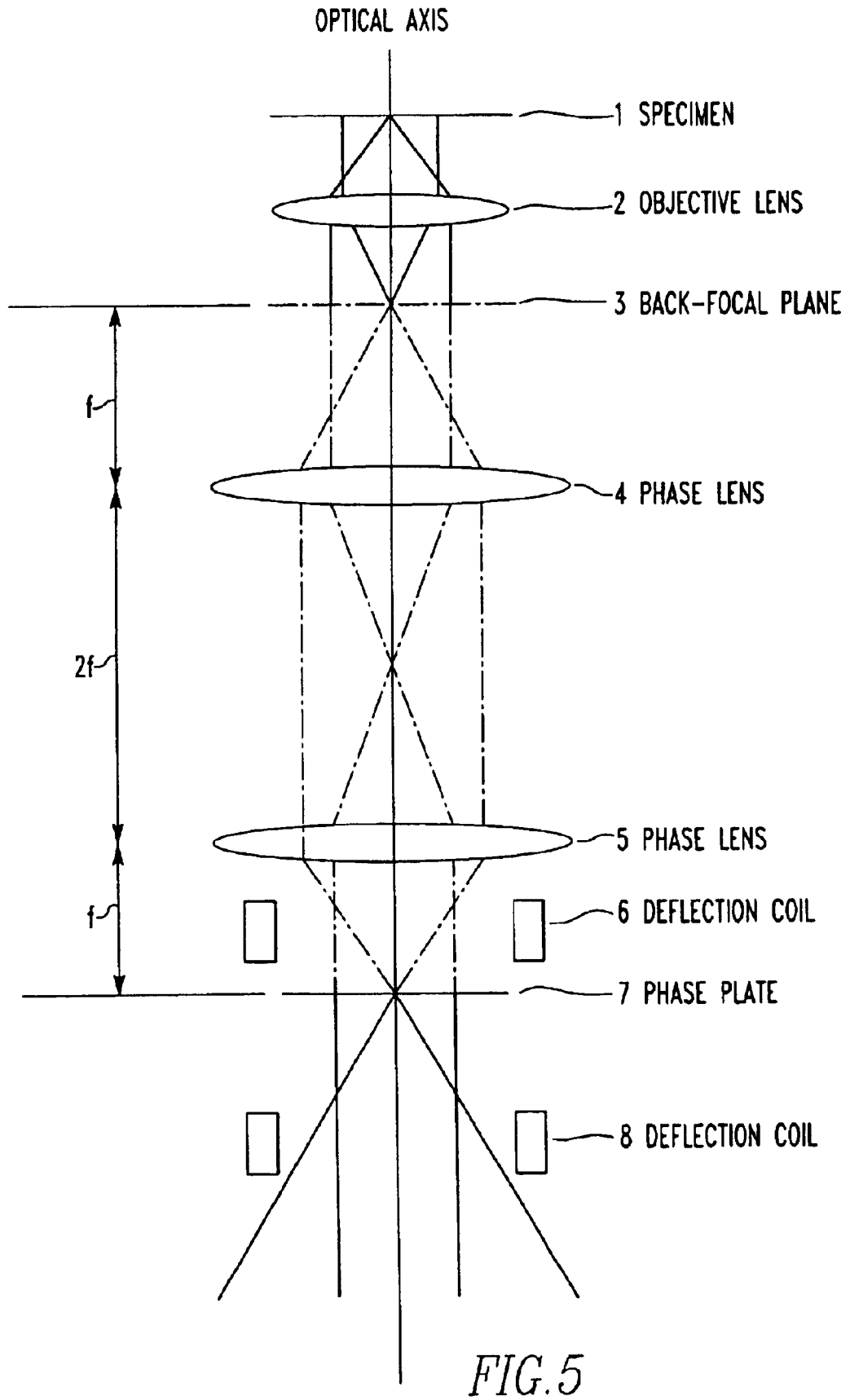
FIG. 5 is a diagram illustrating an example of a TEM in accordance with the present invention.

Referring to FIG. 5, there is shown a transmission electron microscope embodying the concept of the present invention. This instrument has an objective lens 2 forming a back-focal plane 3. A specimen 1 is placed as shown. The microscope further includes phase lenses 4 and 5. Deflection coils 6 and 8 are mounted above and below, respectively, a phase plate 7. It is assumed that the phase lenses 4 and 5 have the same focal length of $f$. Each of the deflection coils 6 and 8 is made of a double deflection coil. These components are positioned as follows. The phase lens 4 is placed at a distance of $f$ from the back-focal plane 3 as measured along the optical axis. The phase lens 5 is placed at a distance of $2f$ from the phase lens 4. The phase plate 7 is placed at a distance of $f$ from the phase lens 5. The deflection coils 6 and 8 are placed immediately above and immediately below, respectively, the phase plate 7. In practice, an electron gun for illuminating the specimen 1 with an electron beam, a system of condenser lenses placed above the specimen 1, an intermediate lens for forming an image of the specimen 1, and a projector lens and a fluorescent screen under the deflection coils 6 and 8 are mounted, but these components are omitted from FIG. 5.

FIG. 5 illustrates the manner in which the lenses according to the present invention act on four electron trajectories going out of the specimen 1. The trajectories are indicated by solid lines from the specimen to the back-focal plane 3. These trajectory portions are the same as those in normal TEM not associated with the present invention. The trajectories are indicated by broken lines from the back-focal plane 3 to the phase plate 7. The lens system according to the present invention creates a conjugate plane to the back-focal plane 3 on the phase plate 7. If a phase plate cannot be normally placed in the back-focal plane within the TEM due to spatial restrictions, the phase plate can still be used according to this invention.

The illustrated electron trajectories have the feature that the distances of the trajectories from the optical axis are reproduced on the phase plate 7. In addition, the tilts of the trajectories relative to the optical axis on the back-focal plane 3 are reproduced on the phase plate 7. Therefore, the electron trajectory portions behind the phase plate 7 are identical with the trajectory portions behind the back-focal plane of the objective lens in a normal TEM not according to the present invention. Normal imaging can be performed downstream of the phase plate 7 in the instrument according to the present invention by installing an ordinary TEM imaging system after the phase plate 7.

Furthermore, alignment of the electron beam to the phase plate 7 and alignment of the imaging lenses following the phase plate 7 can be performed by the deflection coils 6 and 8 located above and below, respectively, the phase plate 7. Where the phase plate is placed in the back-focal plane, it normally would not be possible to install such alignment coils due to spatial restrictions. The phase lenses according to the present invention creates a conjugate plane to the back-focal plane in a spatially unrestricted location, thus permitting the installation of the coils.

As described thus far, the present invention can yield the following advantages.

(1) A conjugate plane to the objective lens is created in a spatially unrestricted location by a phase plate lens system. A phase plate is placed in the conjugate plane. Consequently, the phase plate can be used even in a TEM where the phase plate could not otherwise be placed in the back-focal plane due to spatial restrictions imposed by the magnetic polepieces of the objective lens.

(2) A conjugate plane to the back-focal plane of the objective lens is created in a spatially unrestricted location by the phase plate lens system. A phase plate is placed in the conjugate plane. Alignment coils are mounted above and below, respectively, the phase plate. Accurate alignment of the electron beam to the phase plate and accurate alignment of the beam to the imaging lenses located after the phase plate can be accomplished.

(3) The lenses included in the lens system for use with the phase plate are designed to perform imaging such that tilts are made conjugate, as well as positions of the electron beam. Therefore, optics placed after the back-focal plane of the conventional TEM objective lens can be positioned after the lens system for the phase plate. Hence, TEM imaging can be performed without sacrificing the high-magnification and low-aberration characteristics of the normal objective lens.

Having thus described our invention with the detail and particularity required by the Patent Laws, what is desired protected by Letters Patent is set forth in the following claims.

The invention claimed is:

1. A lens system for use with a phase plate in a transmission electron microscope having an objective lens forming a back-focal plane, said transmission electron microscope producing an electron beam, said lens system comprising:
   said phase plate located beyond the back-focal plane of the objective lens in an imaging system mounted downstream of the objective lens; and
   lenses for imaging the back-focal plane of the objective lens onto said phase plate such that position and tilt of the electron beam relative to an optical axis on said back-focal plane of the objective lens and on said phase plate are made conjugate.

2. A lens system for use with a phase plate as set forth in claim 1, wherein alignment coils are placed on opposite sides of said phase plate to align the electron beam incident on the phase plate and the electron beam leaving the phase plate, respectively.

3. A transmission electron microscope comprising:
   an objective lens forming a back-focal plane;
   a phase plate located beyond the back-focal plane of the objective lens in an imaging system mounted downstream of the objective lens;
   imaging lenses for imaging the back-focal plane of the objective lens onto said phase plate such that position and tilt of the electron beam relative to an optical axis on said back focal plane of the objective lens and on said phase plate are made conjugate; and an alignment coil for directing the electron beam going out of said lenses toward said phase plate.

4. The transmission electron microscope of claim 3, further including an additional alignment coil for directing the electron beam going out of said phase plate toward said imaging lenses located after said phase plate.

* * * * *